US006735536B2

(12) United States Patent
Rider

(10) Patent No.: US 6,735,536 B2
(45) Date of Patent: May 11, 2004

(54) METHOD AND APPARATUS FOR TESTING BATTERIES ON A GOLF CAR

(75) Inventor: Robert A. Rider, Augusta, GA (US)

(73) Assignee: Textron Inc., Providence, RI (US)

( * ) Notice: Subject to any disclaimer, the term of this patent is extended or adjusted under 35 U.S.C. 154(b) by 121 days.

(21) Appl. No.: 09/785,513

(22) Filed: Feb. 16, 2001

(65) Prior Publication Data

US 2002/0116140 A1 Aug. 22, 2002

(51) Int. Cl.[7] ............................................. G06F 19/00
(52) U.S. Cl. ........................................................ 702/63
(58) Field of Search ............................ 702/63; 320/116, 320/134, 124, 132, 153; 221/135; 324/430, 433

(56) References Cited

U.S. PATENT DOCUMENTS

| | | | | |
|---|---|---|---|---|
| 5,544,784 A | * | 8/1996 | Malaspina | 221/135 |
| 5,574,355 A | | 11/1996 | McShane et al. | |
| 5,592,093 A | | 1/1997 | Klingbiel | |
| 5,623,195 A | * | 4/1997 | Bullock et al. | 320/153 |
| 5,652,502 A | * | 7/1997 | van Phuoc et al. | 320/134 |
| 5,757,192 A | | 5/1998 | McShane et al. | |
| 5,789,901 A | * | 8/1998 | Lomholt | 320/134 |
| 5,821,756 A | | 10/1998 | McShane et al. | |
| 5,831,435 A | | 11/1998 | Troy | |
| 5,914,605 A | | 6/1999 | Bertness | |
| 6,031,354 A | * | 2/2000 | Wiley et al. | 320/116 |
| 6,051,976 A | | 4/2000 | Bertness | |
| 6,097,176 A | * | 8/2000 | Yao et al. | 320/132 |
| 6,332,113 B1 | * | 12/2001 | Bertness | 320/116 |

\* cited by examiner

Primary Examiner—John Barlow
Assistant Examiner—Tung Lau
(74) Attorney, Agent, or Firm—Harness, Dickey & Pierce P.L.C.

(57) ABSTRACT

A battery management system used for monitoring battery pack characteristics for electric or hybrid vehicles. The battery management system includes a processing unit which is easily connected to a battery pack of a vehicle for testing the battery pack according to the test method of the present invention. The battery management system tests a battery pack and records, stores and analyzes test data. The battery management system may also transfer data to a computer unit. The computer unit can share data and analysis on a network or the Internet.

13 Claims, 2 Drawing Sheets

METHOD AND APPARATUS FOR TESTING BATTERIES ON A GOLF CAR

TECHNICAL FIELD

The present invention is related to a method and apparatus for monitoring batteries and, more particularly to an improved method and apparatus for monitoring battery systems of a golf car.

DISCUSSION

In recent times, an increasing amount of research and development has been directed toward extending the life of battery packs used to power electric or hybrid vehicles. Improvements in battery life result in greater utility of the particular vehicle and lower overall costs. The lower costs inure to both the vehicle manufacturer, in the form of reduced warranty, and to the vehicle owner, in the form of reduced repair, trouble shooting, and replacement.

A particular area of research focuses on the operational characteristics of a battery pack during its lifetime. Battery packs generally comprise multiple batteries connected in series or parallel fashion. As such, poor operation of a single battery within the battery pack can degrade operation of the battery pack as a complete unit. Thus, it is important to be able to test the battery packs and monitor individual battery characteristics.

Traditional testing methods monitor individual battery voltage and require, in sequence, that the battery pack be fully charged, discharged, individual voltages measured, and recharged to put the vehicle back into service. Such methods are not cost effective in that a particular vehicle must be removed from operation for an extended period of time in order to complete the test and fully charge the battery pack for further use. Additionally, traditional test apparatuses are inefficient because the battery pack and individual batteries must be directly accessible.

Additionally, battery pack performance is a concern for particular parties. For example, the golf industry utilizes fleets of battery powered golf cars for carrying golfers and clubs around golf courses. As such, a golf club's management is concerned with the operation and battery life of the golf cars which they purchase from manufacturers. The golf car manufacturers are also concerned about the quality of golf car they are providing to their customers. Finally, the battery pack manufacturers are also concerned about the quality of battery packs which they are providing to their customers and warranty costs which they will incur as the result of poor battery performance.

It is therefore desirable to provide a battery management system which can efficiently monitor the operational life of a series of batteries within a battery pack.

It is further desirable to provide a battery management system which can record and analyze historical data of battery packs and share the data with other concerned parties in remote locations.

SUMMARY OF THE INVENTION

Accordingly, the present invention provides a battery management system for testing batteries of an electric or hybrid vehicle. In particular, the present invention enables an operator to monitor the quality of particular batteries in a battery pack during the lifetime of the battery pack. As such, an operator is able to determine when a particular battery need be replaced. Furthermore, the battery management system enables analysis and distribution of battery pack information to concerned parties.

A battery management system is provided for managing a battery pack of an electric or hybrid vehicle. The battery pack includes a plurality of batteries. The battery management system includes a first interface component, in electrical communication with the battery pack and a second interface component in selective electrical communication with the first component. A circuit is also included which is in electrical communication with a second interface component. The circuitry is adapted to measure a first parameter of each of the batteries of the battery pack and compare the first parameter of a particular battery to the remaining batteries. An output is further provided for signaling an operator if a result of the first parameter comparison is not within a predetermined range.

The method of the present invention is implemented for testing a battery pack of an electric or hybrid vehicle when the battery pack comprises a plurality of batteries. The method of the present invention includes the steps of measuring a first parameter of each battery of the battery pack, selecting the first parameter value of a particular battery of the battery pack, determining an average first parameter value of the remaining batteries of the battery pack, determining a result in value of a function of the isolated first parameter and the average first parameter value of the remaining batteries, providing an alert signal if the result in value is not within a predetermined range. This process is then repeated for each battery of the battery pack.

The battery management system can also be in communication with a computer system. The computer system can further analyze battery pack information and transmit results or other information via a network, to concerned parties.

One advantage of the present invention is that a simplified, nonintrusive solution is provided for monitoring the lifetime performance of a battery pack.

A second advantage of the present invention is that each battery of the battery pack is monitored and the data from each battery can be stored for analytical purposes. In this way, specific problems within the battery pack, during the lifetime of the battery pack, can be identified easily and dealt with quickly.

Another significant advantage of the present invention is the speed of the testing process. The present invention eliminates charge and discharge steps of traditional battery testing systems, enabling a vehicle to be quickly tested and put back into service.

A further advantage of the present invention is the quick accessibility of the battery pack and the battery to the testing apparatus.

For a more complete understanding of the invention, its objects and advantages, reference should be made to the following specification and to the accompanying drawings.

BRIEF DESCRIPTION OF THE DRAWINGS

The drawings, which form an integral part of the specification, are to be read in conjunction therewith, and like reference numerals are employed to designate identical components in the various views.

DETAILED DESCRIPTION OF THE INVENTION

Figure 1:
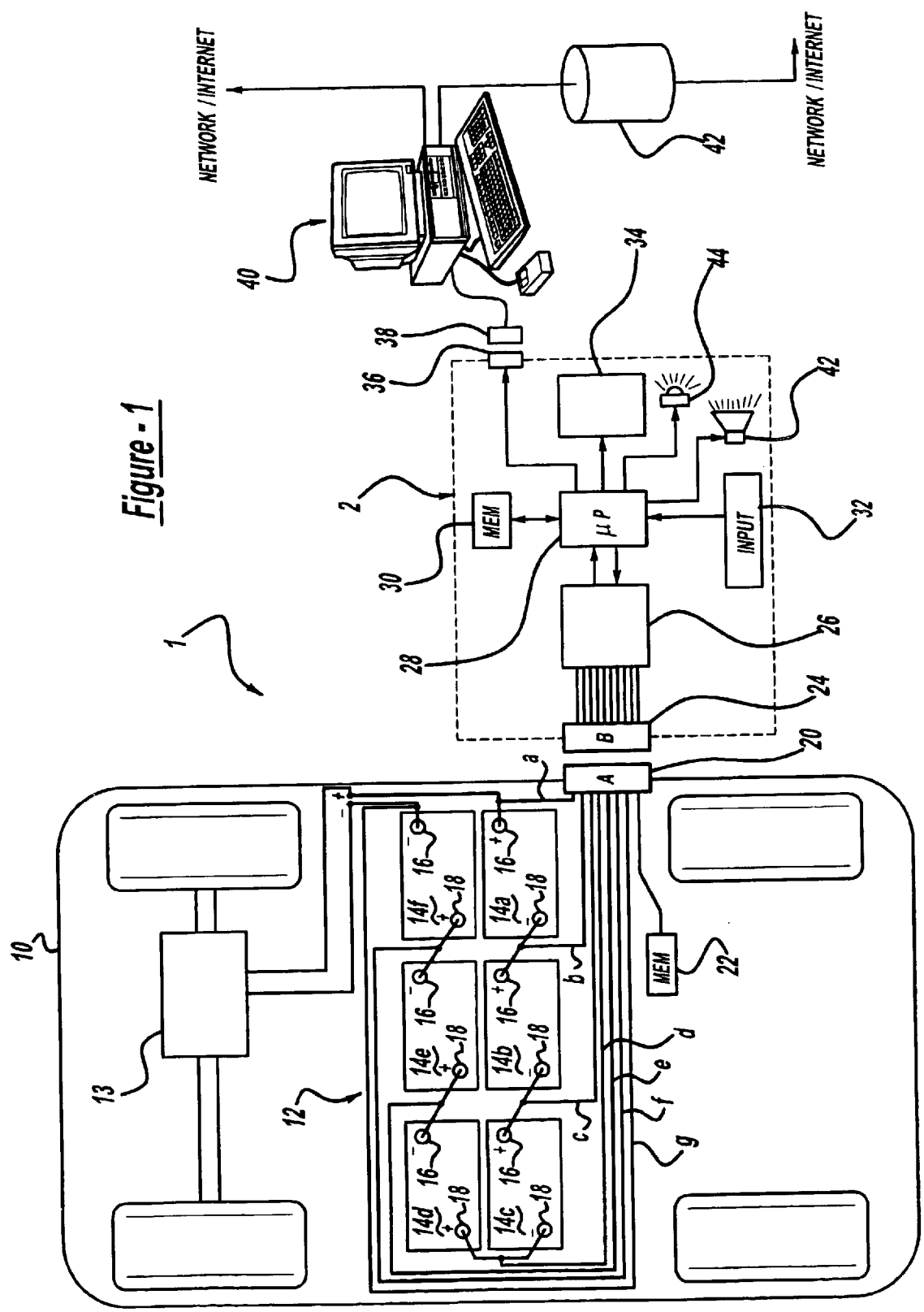
FIG. 1 is a schematic view of the battery management system according to the principles of the present invention.

The present invention provides a battery management system 1 for monitoring and testing a battery pack of an electric or hybrid vehicle. With particular reference to FIG. 1, an electric or hybrid vehicle 10, such as a golf car, is shown. In a preferred embodiment, the vehicle 10 includes a battery pack 12 comprising six individual six-volt batteries 14, labeled sequentially 14a through 14f. Thus, the preferred embodiment is a 36-volt system. It should be noted, however, that the present invention is equally applicable to other voltage systems, including 12 volt and 24 volt systems. This configuration is merely exemplary in nature and it should be appreciated that the number and rating of the batteries 14 may be varied. Each battery 14 has a positive and a negative terminal 16, 18, respectively. The batteries 14 of the battery pack 12 are shown preferably connected in a series configuration. As such, the positive terminal 16 of the first battery is in electrical communication with the negative terminal 18 of the second battery, whose positive terminal 16 is in electrical communication with the negative terminal 18 of a third battery and so on. The battery pack 12 is in electrical communication with an electric motor 13 for driving the vehicle 10.

The vehicle also includes an interface component 20 which is interconnected with the battery pack 12. Specifically, the interface component 20 includes seven leads (a, b, c, d, e, f, g) to the battery pack 12. The first lead (a) is connected to the negative output terminal of the battery 14a, the second lead (b) is connected to the series connection between battery 14a and battery 14b, the third lead (c) is connected to the series connection between the battery 14b and battery 14c, the fourth lead (d) is connected to the series connection between the battery 14c and battery 14d, the fifth lead (e) is connected to the series connection between battery 14d and battery 14e, the sixth lead (f) is connected to the series connection between the battery 14e and battery 14f, and the seventh lead (g) is connected to the positive output terminal of the battery 14f.

The vehicle 10 can optionally include a memory unit 22 which is able to store information such as vehicle number, battery ID, and other desired details. The memory unit 22 is also connected to the interface component 20 and may communicate using any of a number of serial or parallel communications protocols. The battery management system 1 includes a processing unit 2 having a second interface component 24 which is selectively connectable to the interface component 20 of the vehicle 10. The processing unit 2 further includes a circuit 26 which connects to the second interface component 24. The circuit 26 also connects to a microprocessor 28 to send and receive communication signals. The microprocessor 28 interconnects to a memory unit 30. The memory unit 30 is of a read/write variety, storing recorded data, instructions and algorithms for running the battery management procedure.

The microprocessor 28 also communicates with an input device 32. The input device 32 could include a keyboard, a keypad, a touch pad, or other device commonly known in the art. The input device 32 may be used by an operator to input information or select from a variety of process parameters. Additionally, the microprocessor 28 interconnects to an output device 34 for outputting information and results from the battery management procedure. The output device 34 could include a display screen or other device commonly known in the art. The microprocessor 28 implements the battery testing procedure of the present invention, discussed in detail below, and performs all required calculations.

The processing unit 2 also includes an output connector 36 for connection with an input connector 38 of a computer unit 40. In this manner, the processing unit 2, which may be portable, is able to download test information to the computer unit 40. In turn, the computer unit 40 may be in communication with a network or the Internet for further communicating test information with other concerned parties, such as the battery pack manufacturer or a warranty center. Alternatively, the computer unit 40 may be connected to a database 42 which is further connected to a network or the Internet. The computer unit 40 may also program or reprogram the processing unit 2 in order to update the test procedure as necessary. The computer unit 40 may also communicate with the memory 22 through the processing unit 2.

Figure 2:
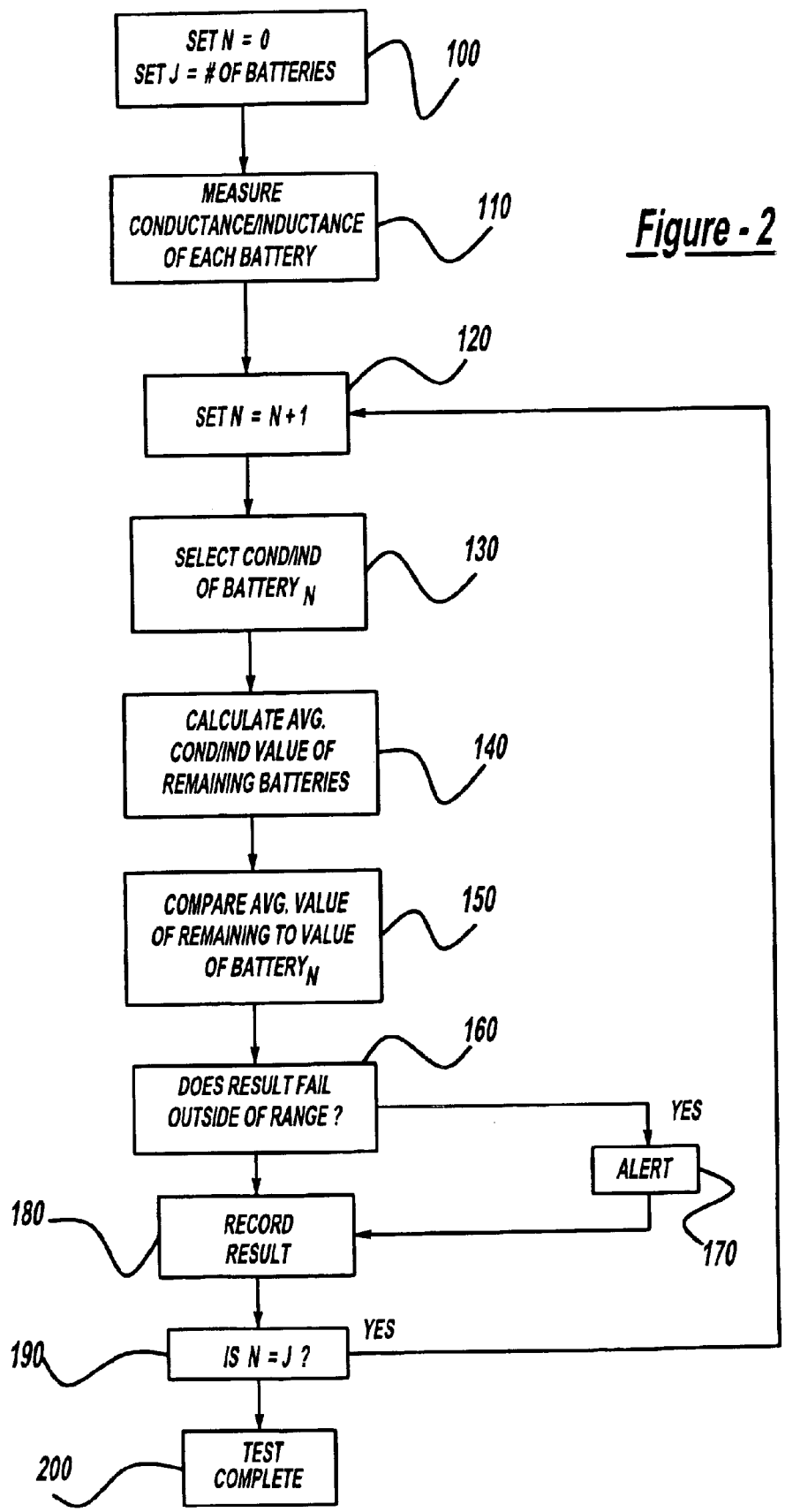
FIG. 2 is a flow diagram of the operation of the battery management system.

FIG. 2 shows a flow chart outlining the monitoring procedure of the present invention. Once the monitoring procedure has been initiated by the microprocessor 28, the microprocessor 28 sets a first variable N equal to zero and a second variable J equal to the number of batteries 14 within the battery pack 12 at step 100. The microprocessor 28 is able to automatically determine the number of batteries 14 within the battery pack 12 through information received from the memory unit 22.

In a first preferred embodiment at step 110, the circuit 26 measures the conductance of each battery 14 in the battery pack 12 and sends a signal to the microprocessor 28 that varies in accordance with the measured conductance. Measuring the conductance may be carried out using procedures and devices described in U.S. Pat. No. 5,945,829 to Bertness. This patent is incorporated by reference herein. In a second preferred embodiment at step 110, the circuit 26 measures the impedance or conductance of each battery 14. The variable N is then increased by one at step 120. At step 130, the microprocessor 28 selects the measured value of a particular battery (battery N) as a comparison value. At step 140, the microprocessor 28 calculates the average measured value of the remaining batteries 14. The average measured value of the remaining batteries 14 is compared to the comparison value of the particular battery to determine a resultant value at step 150. The microprocessor 28 determines whether or not this resultant value falls within a predetermined range at step 160. The predetermined range is pre-set by battery manufacturer standards.

If the resultant value falls outside of the predetermined range, an alert is signaled at step 170 and the result is recorded at step 180. The alert may be provided on the output device 34, or be an audible signal given by a speaker 42, or even a visual signal from a light 44. If the result does not fall outside of the predetermined range the result is recorded at step 180, without alert. The microprocessor 28 determines whether N is equal to J, at step 190, thus determining whether each battery 14 of the battery pack 12 has been tested. If N is not equal to J the process is repeated beginning at step 120. If N is equal to J then the test is complete at step 200.

While the invention has been described in its presently preferred form, it is to be understood that there are numerous applications and implementations for the present invention. Accordingly, the invention is capable of modification and changes without departing from the spirit of the invention as set forth in the appended claims.

What is claimed is:

1. A method for testing a battery pack of an electric or hybrid vehicle, the battery pack having a plurality of batteries, comprising:

measuring a first parameter of a battery in the battery pack;

determining an average of first parameter values of the remaining batteries in the battery pack, the average first parameter value for remaining batteries changing depending on which battery of the battery pack is being tested at a given instant;

comparing the measured first parameter value to the average to obtain a result;

outputting an alert signal if the result is not within a given range, else storing the result of the comparison, the measuring, determining, comparing and outputting or storing repeated until each battery in the battery pack has been tested.

2. The method of claim 1, wherein the first parameter is battery conductance.

3. The method of claim 1, wherein the first parameter is battery impedance.

4. The method of claim 1, wherein the alert signal is an audible signal.

5. The method of claim 1, wherein the alert signal is a visual signal.

6. The method of claim 5, wherein the visual signal includes a light.

7. The method of claim 5, wherein the visual signal is shown on a display screen.

8. A battery management system for managing a battery pack of an electric or hybrid vehicle, the battery pack including a plurality of batteries, comprising:

a first interface component in electrical communication with the battery pack for receiving a first parameter of each battery in the battery pack;

a second interface component in selective electrical communication with the first interface component;

a processor in electrical communication with the second interface component via a circuit, the circuit measuring the first parameter of one of the batteries in the battery pack, the processor determining an average of first parameter values of the remaining batteries in the battery pack, the average first parameter value for remaining batteries changing depending on which battery of the battery pack is being tested at a given instant, and the processor comparing the measured first parameter value received from the circuit to the average to obtain a result; and an output device signaling an operator if the result is outside a given range, else a memory storing the result.

9. The battery management system of claim 8, wherein the first parameter is battery conductance.

10. The battery management system of claim 8, wherein the first parameter is battery impedance.

11. The battery management system of claim 8, further comprising an input device operatively connected to the processor, the input device configured as at least one of a keyboard, keypad and touch screen.

12. The battery management system of claim 8, wherein the battery management system is selectively in communication with a computer unit.

13. The battery management system of claim 8, wherein the battery management system is selectively in communication with a network.

* * * * *